US012799598B2

(12) United States Patent
Hatano et al.

(10) Patent No.: US 12,799,598 B2
(45) Date of Patent: Nov. 17, 2026

(54) SUBSTRATE HEATING DEVICE, SUBSTRATE HEATING METHOD, AND METHOD OF MANUFACTURING SUBSTRATE HEATER

(71) Applicant: Tokyo Electron Limited, Tokyo (JP)

(72) Inventors: Tatsuo Hatano, Nirasaki City (JP); Naoki Watanabe, Nirasaki City (JP)

(73) Assignee: Tokyo Electron Limited, Tokyo (JP)

(*) Notice: Subject to any disclaimer, the term of this patent is extended or adjusted under 35 U.S.C. 154(b) by 326 days.

(21) Appl. No.: 17/650,133

(22) Filed: Feb. 7, 2022

(65) Prior Publication Data

US 2022/0259727 A1 Aug. 18, 2022

(30) Foreign Application Priority Data

Feb. 15, 2021 (JP) ................................ 2021-021481

(51) Int. Cl.

*C23C 16/458* (2006.01)
*C23C 16/46* (2006.01)
*H01J 37/32* (2006.01)

(52) U.S. Cl.

CPC ........ *C23C 16/4581* (2013.01); *C23C 16/466* (2013.01); *H01J 37/32724* (2013.01);

(Continued)

(58) Field of Classification Search

CPC .............. C23C 16/4581; C23C 16/466; C23C 16/4586; C23C 16/481; C23C 16/06; C23C 16/303; C23C 16/342; C23C 16/345; C23C 16/403; C23C 16/46; C23C 16/50; H01J 37/32724; H01J 2237/002; H01J 2237/3321; H01J 2237/334; H01L 21/67103; H01L 21/67109; H01L 21/67248; H01L 21/6831; H01L 21/68757;

(Continued)

(56) References Cited

U.S. PATENT DOCUMENTS 5,151,845 A * 9/1992 Watanabe ........... H01L 21/6831 279/128
5,835,334 A * 11/1998 McMillin ................ H10P 72/72 279/128

(Continued)

FOREIGN PATENT DOCUMENTS

CN 104272450 A 1/2015
CN 107039326 A 8/2017

(Continued)

*Primary Examiner* — Rudy Zervigon
(74) *Attorney, Agent, or Firm* — Armstrong Teasdale LLP

(57) ABSTRACT

According to embodiments of the present disclosure, a substrate heating device, a substrate heating method, and a method of manufacturing a substrate heater are provided. A substrate heating device for heating a substrate within a processing container configured to perform processing of a substrate therein includes a substrate heater including a placement surface on which the substrate is placed. The substrate heater is configured to heat the substrate placed on the placement surface using a heater. The substrate heating device further includes a jacket provided to cover a bottom portion of the substrate heater via a cooling space and a cooling gas supplier configured to supply a cooling gas to the cooling space.

16 Claims, 7 Drawing Sheets

(52) U.S. Cl.
CPC . *H01J 2237/002* (2013.01); *H01J 2237/3321* (2013.01); *H01J 2237/334* (2013.01)

(58) Field of Classification Search
CPC .......... H01L 21/6833; H01L 21/68785; H05B 3/283
USPC ........................ 118/728, 729, 730, 731, 732; 156/345.45, 345.46, 345.47, 345.48; 269/1; 279/1
See application file for complete search history.

(56) References Cited

U.S. PATENT DOCUMENTS

| | | | | |
|---|---|---|---|---|
| 6,558,508 | B1 * | 5/2003 | Kawakami | H01L 21/67103 118/728 |
| 2002/0036881 | A1 * | 3/2002 | Shamouilian | C04B 35/565 279/128 |
| 2008/0066676 | A1 * | 3/2008 | Mariner | H01L 21/68785 118/724 |
| 2010/0039747 | A1 * | 2/2010 | Sansoni | H01L 21/67103 361/234 |
| 2019/0198298 | A1 * | 6/2019 | Hirose | H01J 37/32532 |

FOREIGN PATENT DOCUMENTS

| | | | |
|---|---|---|---|
| JP | H11-265931 | A | 9/1999 |
| JP | 2002-009064 | A | 1/2002 |
| JP | 2002-0090964 | A | 1/2002 |
| JP | 2010-040422 | A | 2/2010 |
| JP | 2018-518833 | A | 7/2018 |
| KR | 10-2015-0013497 | A | 2/2015 |
| KR | 10-2017-0037526 | A | 4/2017 |

* cited by examiner

SUBSTRATE HEATING DEVICE, SUBSTRATE HEATING METHOD, AND METHOD OF MANUFACTURING SUBSTRATE HEATER

CROSS-REFERENCE TO RELATED APPLICATION

This application is based upon and claims the benefit of priority from Japanese Patent Application No. 2021-021481, filed on Feb. 15, 2021, the entire contents of which are incorporated herein by reference.

TECHNICAL FIELD

The present disclosure relates to a substrate heating device, a substrate heating method, and a method of manufacturing a substrate heater.

BACKGROUND

When performing a process accompanied by heating of a substrate such as a semiconductor wafer, a substrate heating device (heater) on which the substrate is placed and heated is used. For example, Patent Document 1 describes a substrate heating device (heater) including a substrate stage, which is made of aluminum nitride, and in which an attraction electrode element is embedded, and a shaft, which is bonded to the rear surface of the substrate stage.

PRIOR ART DOCUMENT

Patent Document

Patent Document 1: Japanese Laid-Open Patent Publication No. 2010-40422

SUMMARY

According to embodiments of the present disclosure, a substrate heating device, a substrate heating method, and a method of manufacturing a substrate heater are provided. A substrate heating device for heating a substrate within a processing container configured to perform processing of a substrate therein includes a substrate heater including a placement surface on which the substrate is placed. The substrate heater is configured to heat the substrate placed on the placement surface using a heater. The substrate heating device further includes a jacket provided to cover a bottom portion of the substrate heater via a cooling space and a cooling gas supplier configured to supply a cooling gas to the cooling space.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments will be described with reference to the accompanying drawings.

Figure 1:
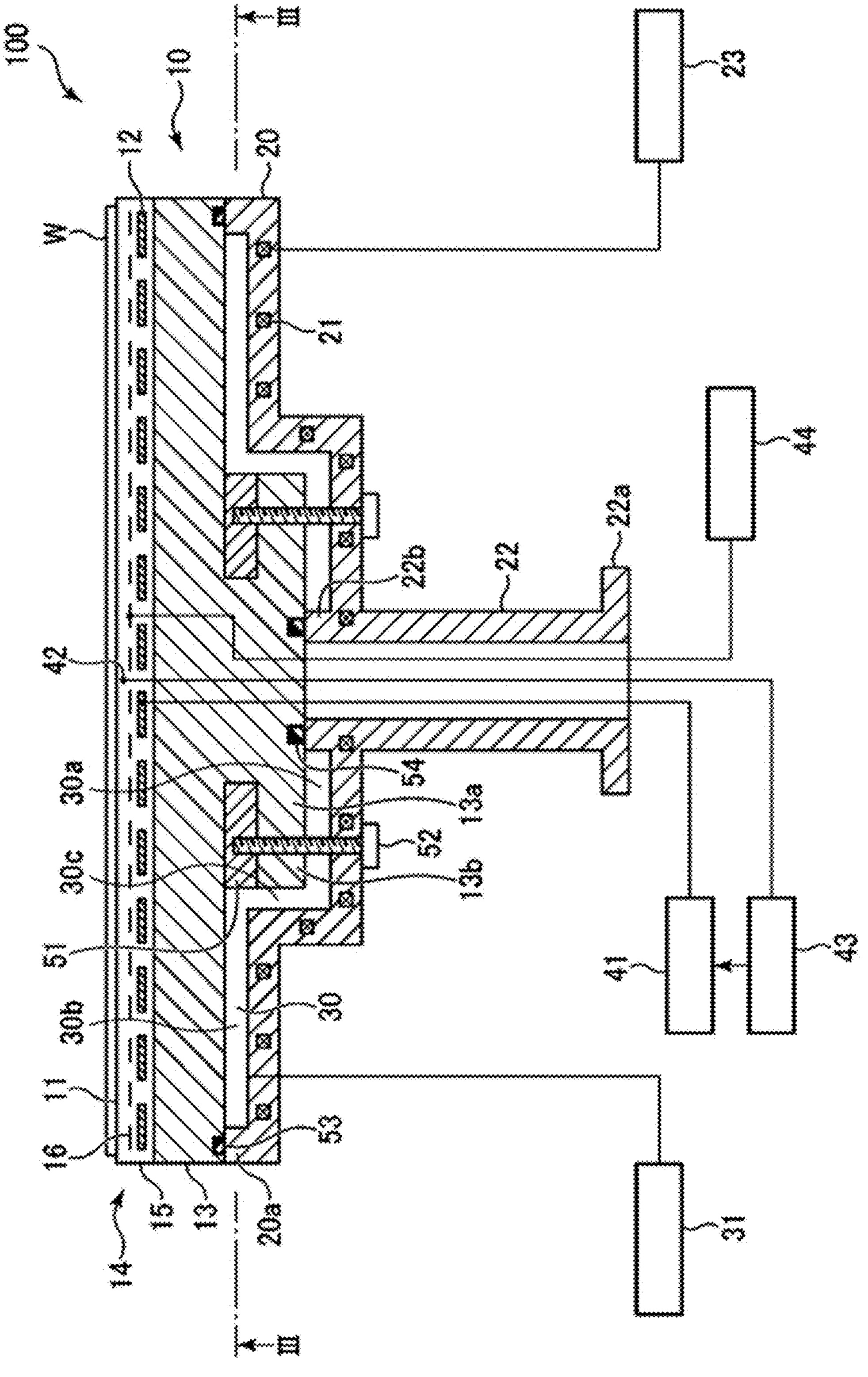
FIG. 1 is a cross-sectional view illustrating a substrate heating device according to an embodiment.

FIG. 1 is a cross-sectional view illustrating a substrate heating device according to an embodiment.

In the present embodiment, a substrate heating device 100 is for heating a substrate W, for example, a semiconductor wafer, and is provided within a processing container configured to perform substrate processing such as a film forming process (CVD) and an etching process. The substrate heating device 100 of the present embodiment is particularly suitable for performing plasma processing as the substrate processing.

The substrate heating device 100 includes a placement surface 11 on which the substrate W is placed, and includes a substrate heater 10 configured to heat the substrate W placed on the placement surface 11, and a jacket 20 provided to cover a bottom portion of the substrate heater 10 via a cooling space 30.

The substrate heater 10 has a substantially disk-like shape, and a heater 12 is embedded therein. The heater 12 is configured as a resistance heating element, and is made of, for example, tungsten (W) or molybdenum (Mo), and generates heat when power is fed from the heater power supply 41 via a feeder line. The substrate heater 10 has a base material 13 and an electrostatic chuck 14 provided on the base material 13. The base material 13 has a stepped shape in which a flange-shaped protrusion **13*a* is formed in the center of the bottom surface of a main body thereof to protrude downward. A plurality of screw insertion holes are formed in a flange portion 13*b* along the circumferential direction, and an annular screw fixing member 51 is fitted between the main body and the flange portion 13*b* so that the jacket 20** can be fixedly screwed as described later.

As the material forming the base material 13, free-cutting ceramics may be used. The free-cutting ceramics have high heat resistance and are suitable for applications in which a substrate W is heated to 300 degrees C. or higher. Moreover, since the free-cutting ceramics have higher thermal shock resistance than conventionally used aluminum nitride (AlN) and alumina ($Al_2O_3$), the free-cutting ceramics are easy to machine. Furthermore, the free-cutting ceramics have relatively high corrosion resistance. As the free-cutting ceramics, Si-based ceramics such as SiC, SiO, and a mixture thereof, or BN-based ceramics may be used. Graphite, aluminum (Al), and copper (Cu) may also be used as the material forming the base material 13. These have high thermal conductivity and high temperature controllability. However, an application of graphite is limited to a non-oxidizing atmosphere, and an application of Al and Cu are limited to be heated to a relatively low temperature of about 200 degrees C. or lower. The base material 13 may be coated with a coating layer made of a material having high corrosion resistance, such as AlN or $Al_2O_3$.

The electrostatic chuck 14 electrostatically attracts a substrate W during plasma processing, and includes an insulator 15 and an attraction electrode 16 embedded therein. Ceramics, such as $Al_2O_3$, AlN, BN, and SiN, may be used as the insulator 15, and W, Mo, and the like may be used in the attraction electrode 16 as in the heater. As the attraction electrode 16, one having a mesh structure may be used. When a DC voltage is applied from a DC power supply 44 to the attraction electrode 16 via the feeder line, the substrate W is attracted by electrostatic attractive force such as Coulomb force via plasma. In the present embodiment, the heater 12 for a heating process is provided at a position below the attraction electrode 16 in the insulator 15 of the electrostatic chuck 14.

The insulator 15, the attraction electrode 16, and the heater 12, which form the electrostatic chuck 14, may be configured as films formed through a film forming technique such as CVD, ALD, or thermal spraying.

A thermocouple 42 as a temperature sensor is provided in the vicinity of the placement surface 11 of the electrostatic chuck 14. A signal of the thermocouple 42 is sent to the temperature controller 43 via the signal line, and a control signal for controlling temperature is sent from the temperature controller 43 to the heater power supply 41.

Figure 2:
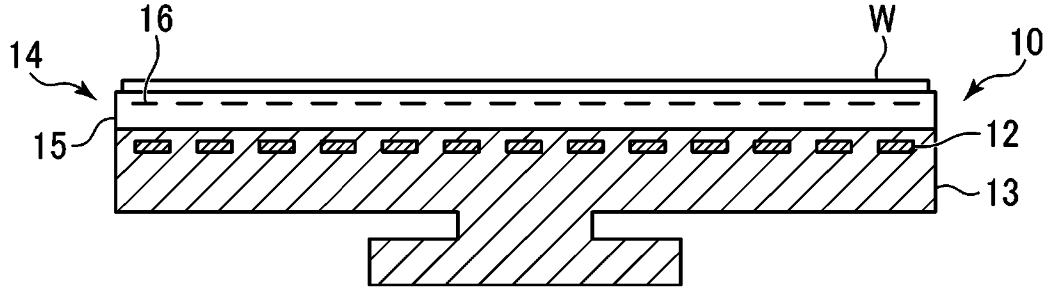
FIG. 2 is a cross-sectional view illustrating another example of a substrate heater.

In the present embodiment, an example in which the heater 12 is provided in the electrostatic chuck 14 in the substrate heater 10 is illustrated, but as illustrated in FIG. 2, the heater 12 may be formed in the base material 13. However, when the base material 13 is conductive, it is necessary to cover the heater 12 with an insulator.

Figure 3:
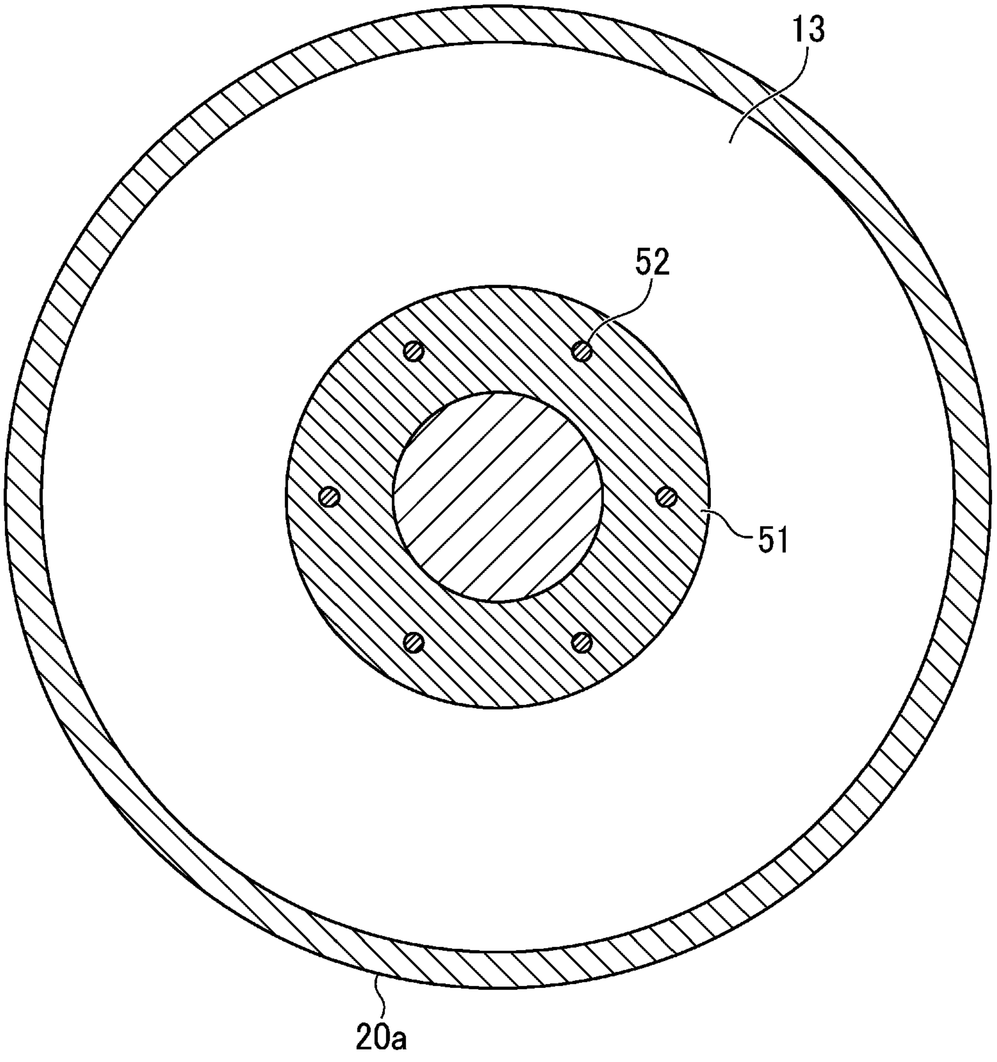
FIG. 3 is a cross-sectional view of the substrate heating device of FIG. 1 taken along line III-III.

The jacket 20 is made of a metal and is provided to cover almost the entire bottom portion of the substrate heater 10 via a cooling space 30, and is fixedly screwed to a central portion of the base material 13 of the substrate heater 10 by a plurality of screws 52. The plurality of screws 52 are inserted into screw insertion holes provided in the flange portion 13*b* of the protruding portion 13*a* along the circumferential direction, and are screwed into the screw fixing member 51 as illustrated in the cross-sectional view of FIG. 3 taken along line in FIG. 1. Such a fastening method is particularly effective when the base material 13 is ceramics. When the base material 13 is made of a metal, the screw 52 may be directly screwed into the base material 13.

The jacket 20 has a shaft 22 provided to protrude downward from the central portion when fastened to the substrate heater 10, and a feeder line and a signal line are inserted through the shaft 22. A flange 22*a* is formed at a lower end of the shaft 22, and the flange 22*a* is attached to the bottom surface of a processing container (not illustrated).

On an outer peripheral portion of the top surface of the jacket 20, an outer peripheral protrusion 20*a* protruding upward and having an annular shape is formed to define the cooling space 30, and a space between the outer peripheral protrusion 20*a* and the outer peripheral portion of the bottom surface of the base material 13 is hermetically sealed by a seal ring 53. In addition, the shaft 22 of the jacket 20 has an inner peripheral protrusion 22*b* protruding upward to define the cooling space 30, and a space between the inner peripheral protrusion 22*b* and the protrusion 13*a* of the base material 13 is hermetically sealed by a seal ring 54. Since the substrate heater 10 is heated to 200 degrees C. or higher, the seal rings 53 and 54 are Kalrez rings (registered trademark) having heat resistance or rings having heat resistance equivalent to that of Kalrez rings (registered trademark).

The jacket 20 has a stepped shape corresponding to the base material 13, and the cooling space 30 between the jacket 20 and the base material 13 also has a stepped shape. Specifically, the cooling space 30 includes a center portion 30*a*, a circumferential portion 30*b* and a stepped portion 30*c*. The center portion 30*a* and the circumferential portion 30*b* can be distinguished by a stepped portion 30*c*. The center portion 30*a* is a space formed on the outside with respect to the stepped portion 30*c*. The circumferential portion 30*b* is a space formed on the inside with respect to the stepped portion 30*c*. The height of the circumferential portion 30*b* is higher than that of the center portion 30*a*.

A cooling gas is supplied to the cooling space 30 from the cooling gas supplier 31. As the cooling gas, an inert gas, such as He gas, $N_2$ gas, or Ar gas, is used. The substrate heater 10 is cooled through heat exchange with the cooling gas supplied to the cooling space 30. A gas discharger (not illustrated) is provided in the cooling space 30, and the pressure in the cooling space 30 can be controlled by adjusting a gas supply amount and a gas discharge amount with respect to the cooling space 30.

A coolant flow path 21 through which a liquid coolant (e.g., cooling water or a CF-based fluid (e.g., Galden (registered trademark)) can flow is formed in the jacket 20, and the coolant can be circulated and supplied from the coolant supplier 23 to the coolant flow path 21. By causing the coolant to flow through the coolant flow path 21, the substrate heater 10 can be cooled more efficiently. However, when the temperature of the substrate heater 10 can be controlled only by supplying the cooling gas to the cooling space 30, the coolant flow path 21 is unnecessary.

Next, the heating process operation by the substrate heating device 100 configured as described above will be described.

First, a substrate W is carried into a processing container (not illustrated) and placed on the placement surface 11 of the substrate heater 10. The placed substrate W is subjected to substrate processing such as a film forming process (CVD) and an etching process, typically plasma processing.

When processing the substrate, the substrate W is heated by the heater 12 in the substrate heater 10. At this time, the cooling gas is supplied to the cooling space 30 between the substrate heater 10 and the jacket 20 to cool the substrate heater 10.

The reason why the substrate heater 10 is cooled in this way is that, for example, the temperature of the substrate W may rise above a set temperature due to heat input from plasma (heat input due to the collision of ions and electrons in the plasma with the substrate W). When the temperature of the substrate W rises above the set temperature, a change in film quality such as crystallinity or an increase in a processing amount (film thickness or etching amount) due to an increase in a reaction rate may occur, and a desired process result may not be obtained.

Figure 4:
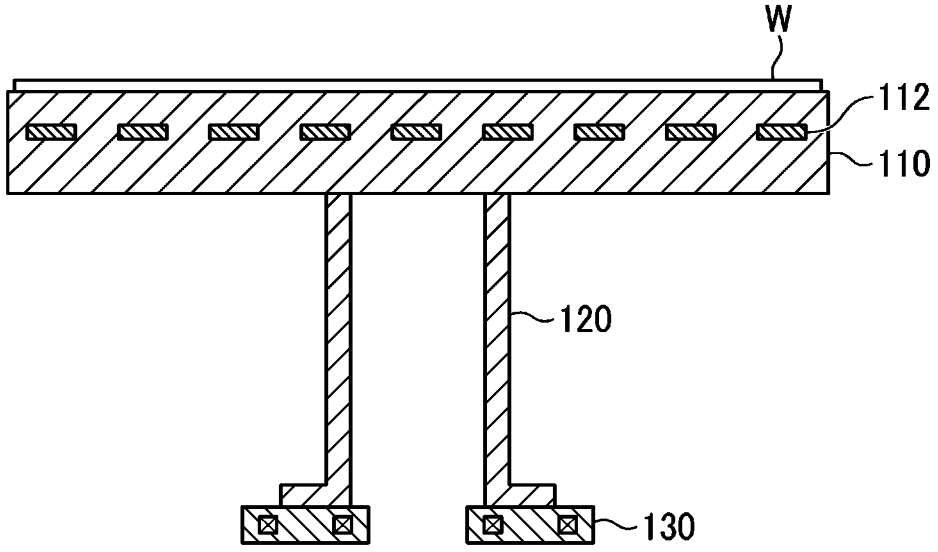
FIG. 4 is a cross-sectional view for describing a cooling method in a conventional substrate heating device.

Conventionally, when the heating temperature of the substrate W is about 200 degrees C., a method of connecting a cooling jacket through which a coolant, such as cooling water, flows to the substrate heater to cool the substrate heater is adopted. Meanwhile, when a substrate is heated to a high temperature of 300 degrees C. or higher, as illustrated in Patent Document 1, a substrate heating device in which a ceramic, such as AlN, is used as a substrate heater configured to place a substrate thereon and a shaft extends downward at the center of the substrate heater is used. The ceramic such as AlN has low thermal shock resistance. Thus, when the ceramic is cooled by the cooling jacket in the state of being heated to 300 degrees C. or higher, the substrate heater may be destroyed by the temperature difference between the portion exposed to plasma and the cooled part. Therefore, as a method of cooling the substrate heater while suppressing destruction due to thermal shock, as illustrated in FIG. 4, there was no choice but to adopt a method of providing a cooling jacket 130 for cooling, via a shaft 120, a substrate heater 110 in which a heater 112 is embedded. However, in this case, it has been found that heat exchange occurs via the shaft 120, and thus temperature controllability is not sufficient.

In contrast, in the present embodiment, the jacket 20 is provided to cover almost the entire bottom portion of the substrate heater 10 via the cooling space 30, and the cooling gas is allowed to flow from the cooling gas supplier 31 to the cooling space 30 to cool the substrate heater 10. As a result, since it is possible to bring the cooling gas into contact with the entire bottom of the substrate heater 10 to exchange heat, high temperature controllability can be obtained. Since the cooling is performed via gas, the thermal shock is lower than that in the case of cooling by directly connecting the cooling jacket through which the coolant flows to the substrate heater 10.

In this case, the jacket 20 is provided with the coolant flow path 21, and the coolant can flow through the coolant flow path 21. As a result, the jacket 20 itself can be cooled, and the cooling efficiency can be further improved.

In addition, by forming the base material 13 of the substrate heater 10 with free-cutting ceramics, high heat resistance can be obtained, which is suitable for applications in which the substrate W is heated to 300 degrees C. or higher. Moreover, since the free-cutting ceramics have higher thermal shock resistance than the conventionally used AlN or $Al_2O_3$, the possibility of being damaged by thermal shock can be further reduced, and a manufacturing cost can be reduced because the free-cutting ceramics are easy to process.

By using a material having high thermal conductivity such as graphite, Al, or Cu as the material of the base material 13, temperature controllability can be improved. Of these, graphite can be applied at a high temperature in a non-oxidizing atmosphere. Al and Cu are inferior in heat resistance, but are suitable for a process at a relatively low temperature of about 200 degrees C. or lower.

Next, an example of a method for manufacturing the substrate heater 10 will be described with reference to FIGS. 5A to 5F. FIGS. 5A to 5F are cross-sectional views schematically illustrating steps of an example of a method for manufacturing the substrate heater 10.

Figure 5A:
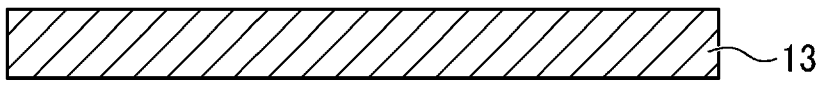
FIGS. 5A to 5F are cross-sectional views schematically illustrating steps of an example of a method for manufacturing a substrate heater.

First, the base material 13 obtained by processing a material is prepared (FIG. 5A). As the base material 13, free-cutting ceramics, graphite, Al, Cu may be used.

Figure 5B:
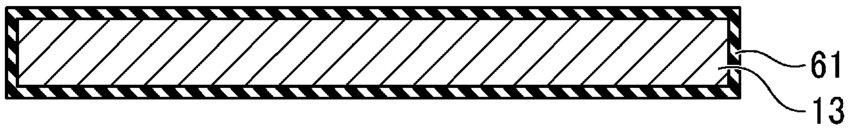

Next, an insulating layer 61 is formed on a surface of the base material 13 (FIG. 5B). As the insulating layer 61, ceramics such as $Al_2O_3$, AlN, boron nitride (BN), and silicon nitride (SiN) may be used. These are also corrosion-resistant materials. The insulating layer 61 is formed through a film forming technique such as CVD, ALD, or thermal spraying. The insulating layer 61 is formed on the entire surface of the base material 13.

Figure 5C:
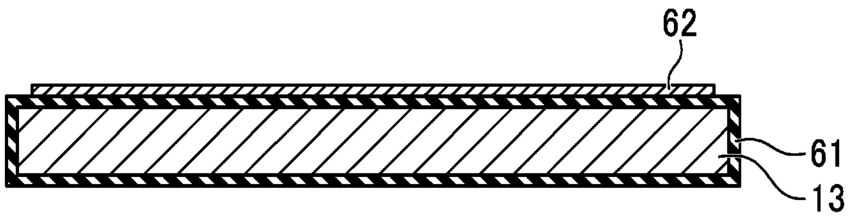

Next, a resistance heating element layer 62 to be a heater 12 is formed on a top surface of the insulating layer 61 through the same film forming technique as the insulating layer 61 (FIG. 5C). The resistance heating element layer 62 is formed of, for example, W or Mo.

Figure 5D:
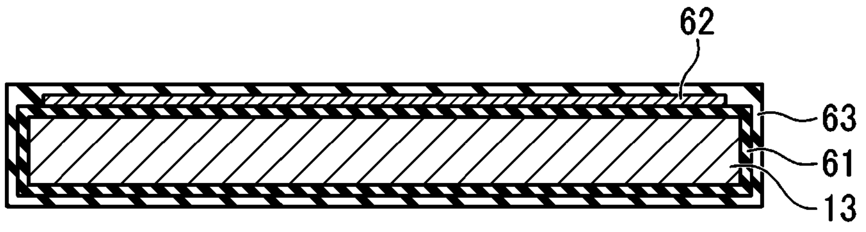

Next, the insulating layer 63 is formed on a top surface of the resistance heating element layer 62 and the entire surface of the exposed insulating layer 61 through the same film forming technique as the insulating layer 61 (FIG. 5D). The portion of the insulating layer 63 formed on the insulating layer 61 is configured as an insulating layer integrated with the insulating layer 61.

Figure 5E:
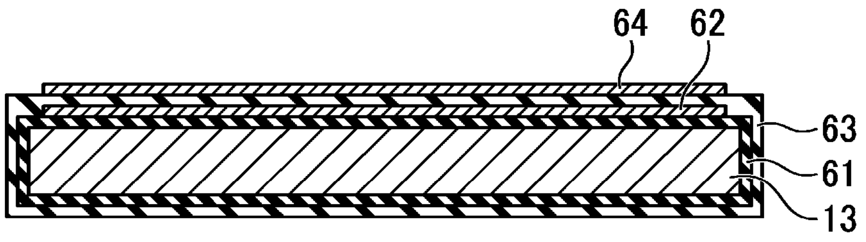

Next, an electrode layer 64 to be an attraction electrode 16 is formed on a top surface of the insulating layer 63 through the same film forming technique as the insulating layer 61 (FIG. 5E). The electrode layer 64 is formed of, for example, W or Mo.

Figure 5F:
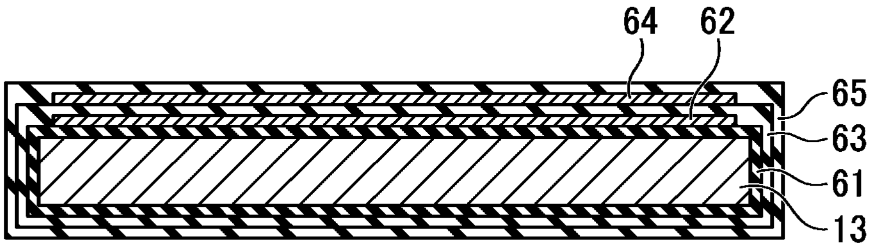

Next, an insulating layer 65 is formed on a top surface of the electrode layer 64 and the entire surface of the exposed insulating layer 63 through the same film forming technique as the insulating layer 61 (FIG. 5F). The portion of the insulating layer 65 formed on the insulating layer 63 is configured as an insulating layer integrated with the insulating layers 61 and 63.

Figure 6:
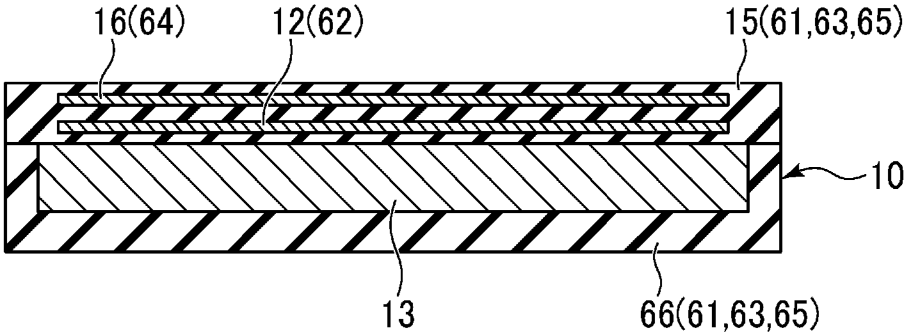
FIG. 6 is a cross-sectional view schematically illustrating a substrate heater obtained by the manufacturing method illustrated in FIGS. 5A to 5F.

Through the above steps, the resistance heating element layer 62 and the electrode layer 64 are formed between the insulating layers 61, 63, and 65 formed on the top surface of the base material 13, and the insulating layers 61, 63, and 65 are also formed on the side surface and the bottom surface of the base material 13. That is, as illustrated in FIG. 6, the insulating layers 61, 63, and 65 formed on the top surface of the base material 13 serve as the insulator 15 of the electrostatic chuck 14, the resistance heating layer 62 serves as the heater 12, and the electrode layer 64 serves as the attraction electrode 16, so that the heater 12 and the electrostatic chuck 14 are formed. In addition, the insulating layers formed on the side surface and the bottom surface of the base material 13 serve as a coating layer 66 for enhancing corrosion resistance.

As described above, through the film forming technique, the heater 12, the electrostatic chuck 14, and the coating layer 66 for enhancing the corrosion resistance can be collectively formed, and the steps can be simplified.

Although embodiments have been described above, it should be considered that the embodiments disclosed herein are exemplary in all respects and are not restrictive. The embodiments described above may be omitted, replaced, or modified in various forms without departing from the scope and spirit of the appended claims.

For example, in the above embodiments, the substrate heating device used in a processing container for performing plasma processing has been mainly described, but the substrate heating device can also be applied to a process that does not use plasma, such as thermal CVD. Furthermore, in the above embodiments, an example in which a substrate is attracted by the electrostatic chuck is illustrated, but an electrostatic chuck may not be used.

According to the present disclosure, there are provided a substrate heating device, a substrate heating method, and a method of manufacturing a substrate heater in which temperature controllability is good and damage by thermal shock is less likely to occur.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate heating device for heating a substrate within a processing container configured to perform processing of a substrate therein, the substrate heating device comprising:
- a substrate heater including a placement surface on which the substrate is placed, the substrate heater being configured to heat the substrate placed on the placement surface using a heater;
- a jacket provided to cover a bottom portion of the substrate heater via a cooling space; and
- a cooling gas supplier configured to supply a cooling gas to the cooling space,
- wherein the bottom portion of the substrate heater has a stepped shape in which a central portion of the bottom portion protrudes further downward than a peripheral portion of the bottom portion, and the jacket has a stepped shape that corresponds to the stepped shape of the bottom portion of the substrate heater,
- wherein the jacket includes a first protrusion protruding upward from a peripheral portion of the jacket and a second protrusion protruding upward from a central portion of the jacket, and
- wherein the first protrusion is in contact with the peripheral portion of the bottom portion of the substrate heater and the second protrusion is in contact with the central portion of the bottom portion of the substrate heater, so that the first protrusion and the second protrusion define the cooling space to have a stepped shape in which a height of a peripheral portion of the cooling space is higher than a central portion of the cooling space.

2. The substrate heating device of claim 1, wherein the processing of the substrate in the processing container is plasma processing.

3. The substrate heating device of claim 2, wherein the substrate heater includes:
- a base material as the bottom portion of the substrate heater; and
- an electrostatic chuck provided on a top surface of the base material, the electrostatic chuck including an electrical insulator and an attraction electrode provided inside the electrical insulator, and the electrostatic chuck being configured to electrostatically attract the substrate to the placement surface by applying a DC voltage to the attraction electrode.

4. The substrate heating device of claim 3, wherein the electrical insulator and the attraction electrode of the electrostatic chuck are configured as films.

5. The substrate heating device of claim 4, wherein the heater is provided inside the electrical insulator of the electrostatic chuck.

6. The substrate heating device of claim 5, wherein the heater is configured as a film.

7. The substrate heating device of claim 6, wherein the base material is made of any of free-cutting ceramics, graphite, aluminum, and copper.

8. The substrate heating device of claim 7, wherein the substrate heater further includes a coating layer provided on a side surface and a bottom surface of the base material and made of a corrosion-resistant material.

9. The substrate heating device of claim 8, wherein at an outer peripheral portion of a top surface of the jacket, an outer peripheral protrusion having an annular shape protruding upward is formed to define the cooling space, and a space between the outer peripheral protrusion and an outer peripheral portion of a bottom surface of the substrate heater is hermetically sealed by a seal ring.

10. The substrate heating device of claim 9, wherein the jacket is fixedly screwed to a central portion of the substrate heater by a plurality of screws.

11. The substrate heating device of claim 1, wherein the jacket includes a shaft provided to protrude downward from the central portion of the jacket, and a lower end of the shaft is installed on a bottom portion of the processing container.

12. The substrate heating device of claim 3, wherein the heater is provided inside the electrical insulator of the electrostatic chuck.

13. A substrate heating method of heating a substrate using a substrate heating device in a processing container configured to perform processing of a substrate therein,
- wherein the substrate heating device includes a substrate heater including a placement surface on which the substrate is placed and configured to heat the substrate placed on the placement surface using a heater, a jacket provided to cover a bottom portion of the substrate heater via a cooling space, and a cooling gas supplier configured to supply a cooling gas to the cooling space,
- wherein the bottom portion of the substrate heater has a stepped shape in which a central portion of the bottom portion protrudes further downward than a peripheral portion of the bottom portion, and the jacket has a stepped shape that corresponds to the stepped shape of the bottom portion of the substrate heater,
- wherein the jacket includes a first protrusion protruding upward from a peripheral portion of the jacket and a second protrusion protruding upward from a central portion of the jacket,
- wherein the first protrusion is in contact with the peripheral portion of the bottom portion of the substrate heater and the second protrusion is in contact with the central portion of the bottom portion of the substrate heater, so that the first protrusion and the second protrusion define the cooling space to have a stepped shape in which a height of a peripheral portion of the cooling space is higher than a central portion of the cooling space, and
- wherein the substrate heating method comprises:
  - placing the substrate on the placement surface of the substrate heater;
  - heating the substrate using the heater of the substrate heater when processing the substrate; and
  - cooling the substrate heater by supplying the cooling gas to the cooling space.

14. The substrate heating method of claim 13, wherein the processing of the substrate in the processing container is plasma processing.

15. The substrate heating method of claim 14, wherein the substrate heating device includes an electrostatic chuck configured to electrostatically attract the substrate to the placement surface and electrostatically attracts the substrate when the substrate is placed on the placement surface.

16. The substrate heating device of claim 1, wherein the jacket includes a coolant flow path, through which a liquid coolant flows, formed in the jacket,
- wherein the coolant flow path is formed separately from the cooling space,
- wherein the cooling gas supplier is connected to a bottom surface of the peripheral portion of the cooling space, and wherein the cooling gas flows from the peripheral portion of the cooling space to the central portion of the cooling space.

* * * * *